United States Patent
Gondi et al.

(10) Patent No.: US 8,885,435 B2
(45) Date of Patent: Nov. 11, 2014

(54) INTERFACING BETWEEN INTEGRATED CIRCUITS WITH ASYMMETRIC VOLTAGE SWING

(71) Applicant: Silicon Image, Inc., Sunnyvale, CA (US)

(72) Inventors: Srikanth Gondi, Sunnyvale, CA (US); Roger Isaac, San Jose, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 97 days.

(21) Appl. No.: 13/622,286

(22) Filed: Sep. 18, 2012

(65) Prior Publication Data

US 2014/0078838 A1    Mar. 20, 2014

(51) Int. Cl.
   *G11C 5/14*    (2006.01)

(52) U.S. Cl.
   CPC .................... *G11C 5/147* (2013.01)
   USPC ....... 365/226; 365/227; 365/228; 365/189.11

(58) Field of Classification Search
   CPC ....... G06F 11/10; G06F 13/1694; G06F 1/10; H04L 1/08; H04L 1/1867; H04L 25/026; G09G 5/003; H04B 13/00
   USPC ............................. 365/226, 227, 228, 189.11
   See application file for complete search history.

(56) References Cited

U.S. PATENT DOCUMENTS

| | | | |
|---|---|---|---|
| 5,982,210 A | 11/1999 | Rogers | |
| 6,718,473 B1 | 4/2004 | Mirov et al. | |
| 6,748,469 B1 | 6/2004 | Caldwell et al. | |
| 6,845,420 B2 | 1/2005 | Resnick | |
| 6,870,419 B1 | 3/2005 | Garrett et al. | |
| 6,996,749 B1 | 2/2006 | Bains et al. | |
| 7,036,032 B2 | 4/2006 | Mizuyabu et al. | |
| 7,089,444 B1 | 8/2006 | Asaduzzaman et al. | |
| 7,155,617 B2 | 12/2006 | Gary et al. | |
| 7,496,774 B2 | 2/2009 | Lu | |
| 7,505,512 B1 | 3/2009 | Anderson et al. | |
| 2002/0061016 A1 | 5/2002 | Mullaney et al. | |
| 2003/0074515 A1 | 4/2003 | Resnick | |
| 2003/0105896 A1 | 6/2003 | Gredone et al. | |

(Continued)

FOREIGN PATENT DOCUMENTS

EP    0834814    4/1998

OTHER PUBLICATIONS

Office Action mailed Nov. 6, 2013, in U.S. Appl. No. 13/174,630, 13 pages.

(Continued)

*Primary Examiner* — Thong Q Le
(74) *Attorney, Agent, or Firm* — Fenwick & West LLP

(57) ABSTRACT

Embodiments of the invention are generally directed to interfacing between integrated circuits with asymmetric voltage swing. An embodiment of an apparatus includes a first integrated circuit including a first transmitter and a first receiver; a second integrated circuit including a second transmitter and a second receiver; and an interface including communication channel linking the first transmitter with the second receiver and the first receiver with the second transmitter, wherein the communication channel is one of a single channel or a dual channel. The first transmitter is operable to transmit a first signal and the second transmitter is operable to transmit a second signal, a first average voltage swing of the first signal being asymmetric with a second average voltage swing of the second signal.

24 Claims, 8 Drawing Sheets

(56) References Cited

U.S. PATENT DOCUMENTS

| | | |
|---|---|---|
| 2004/0098545 A1 | 5/2004 | Pline et al. |
| 2005/0030200 A1 | 2/2005 | Holt |
| 2005/0174153 A1 | 8/2005 | Saeki |
| 2005/0242851 A1 | 11/2005 | Booth et al. |
| 2006/0192622 A1 | 8/2006 | Narita |
| 2007/0035336 A1 | 2/2007 | Lee |
| 2007/0080718 A1 | 4/2007 | Stojanovic et al. |
| 2007/0230513 A1 | 10/2007 | Talbot et al. |
| 2007/0281741 A1 | 12/2007 | Lu et al. |
| 2008/0164905 A1 | 7/2008 | Hamanaka |
| 2008/0310491 A1 | 12/2008 | Abbasfar et al. |
| 2009/0182912 A1 | 7/2009 | Yoo et al. |
| 2009/0202004 A1* | 8/2009 | Amirkhany .................. 375/259 |
| 2009/0256585 A1 | 10/2009 | Kwon et al. |
| 2009/0289668 A1 | 11/2009 | Baldisserotto et al. |
| 2009/0327565 A1 | 12/2009 | Ware |
| 2010/0060316 A1 | 3/2010 | Kim et al. |
| 2010/0097094 A1 | 4/2010 | Jang |
| 2010/0103994 A1 | 4/2010 | Frans et al. |
| 2010/0127751 A1 | 5/2010 | Lin |
| 2010/0157644 A1 | 6/2010 | Norman |
| 2010/0164539 A1 | 7/2010 | Balamurugan et al. |
| 2010/0296566 A1 | 11/2010 | Beyene et al. |
| 2011/0050280 A1 | 3/2011 | Maddux et al. |
| 2011/0196997 A1 | 8/2011 | Ruberg et al. |
| 2011/0222594 A1 | 9/2011 | Zerbe et al. |
| 2013/0002301 A1 | 1/2013 | Gondi et al. |

OTHER PUBLICATIONS

Non-Final Office Action for U.S. Appl. No. 11/690,659 mailed Feb. 23, 2010.
Notice of Allowance for U.S. Appl. No. 11/690,659 mailed Aug. 25, 2010.
International Search Report and Written Opinion for International Patent Application No. PCT/US2011/023697, Mailed Oct. 25, 2011, 11 pages.
Final Office Action for U.S. Appl. No. 12/704,417, Mailed Feb. 14, 2012, 18 pages.
Kevin Ross, The Basics—Very Basic Circuits, Mar. 1997, www.seattlerobotics.org.
B. Leibowitz, et al., "A 4.3GB/s Mobile Memory Interface With Power-Efficient Bandwidth Scaling," 2009 Symposium on VLSI Circuits Digest of Technical Papers.
B. Razavi, "Prospects of CMOS Technology for High-Speed Optical Communication Circuits," IEEE J. Solid-State Circuits, Sep. 2002.
G. Balamurugan et al., "Modeling and Analysis of High-Speed I/O Links," IEEE Transactions on Advanced Packaging, May 2009.
H. Lee et al., "A 16 Gb/s/Link, 64 GB/s Bidirectional Asymmetric Memory Interface," IEEE J. Solid-State Circuits, Apr. 2009.
H. Partovi, et al., "Single-ended Transceiver Design Techniques for 5.33Gb/s Graphics Applications," IEEE International Solid-State Circuits Conference, Feb. 2009.
High-Definition Multimedia Interface Specification Version 1.3, HDMI Licensing LLC, Jun. 22, 2006, 237 pages.
International Search Report and Written Opinion of the International Searching Authority in International Patent Application No. PCT/US2012/043767, 15 pages.
International Search Report and Written Opinion of the International Searching Authority in International Patent Application No. PCT/US2012/043770, 9 pages.
K-L J. Wong, et al., "A 27mW 3.6-Gb/s I/O Transceiver," IEEE J. Solid-State Circuits, Apr. 2004.
Low Power Double Data Rate 2 (LPDDR2) Standard, JEDEC Solid State Technology Association, Apr. 2011, 284 pages.
Office Action dated Jan. 15, 2013, in U.S. Appl. No. 13/174,630, 13 pages.
Office Action mailed Aug. 2, 2013, in U.S. Appl. No. 13/934,147, 6 pages.
Office Action mailed Aug. 31, 2011, in U.S. Appl. No. 12/704,417, 12 pages.
Office Action mailed Jan. 15, 2013, in U.S. Appl. No. 13/174,616, 15 pages.
S. Palermo et al., "A 90 nm CMOS 16 Gb/s Transceiver for Optical Interconnects," IEEE J. Solid-State Circuits, May 2008.
Seung-Jun Bae, et al., "An 80nm 4Gb/s/pin 32 bit 512Mb GDDR4 Graphics DRAM with Low Power and Low Noise Data Bus Inversion," 2007 IEEE International Solid-State Circuits Conference.
W. D. Dettloff, et al., "A 32mW 7.4Gb/s Protocol-Agile Source-Series Terminated Transmitter in 45nm CMOS SOI," IEEE International Solid-State Circuits Conference, Feb. 2010.
International Preliminary Report on Patentability for International Patent Application No. PCT/US2008/057926 mailed Oct. 8, 2009.
International Search Report & Written Opinion for International Application No. PCT/US2008/57926 mailed Aug. 7, 2008.
PCT International Search Report and Written Opinion, PCT Application No. PCT/US2013/052126, Nov. 25, 2013, 13 pages.
United States Office Action, U.S. Appl. No. 13/174,630, Nov. 6, 2013, 13 pages.

* cited by examiner

INTERFACING BETWEEN INTEGRATED CIRCUITS WITH ASYMMETRIC VOLTAGE SWING

TECHNICAL FIELD

Embodiments of the invention generally relate to the field of electronic devices and, more particularly, to interfacing between integrated circuits with asymmetric voltage swing.

BACKGROUND

In order to provide efficient and effective operation of electronic devices including computing devices, circuits such as computer memory needs to be designed to provide high performance without causing excessive power drain.

In particular, power efficient, high-speed link design is a key element in high data rate chip-to-chip interconnects for interface applications. Issues that affect link design includes high performance communication and computation, the technology of integrated circuits, and the electrical connection between integrated circuits, such the electrical connection between a controller and a computer memory.

Advances in semiconductor technology have eased certain circuit limitations, including making, for example, the digital computing capability and the memory capacity less critical and restricting in computer memory design. However, the electrical interface between integrated circuits remains an important. For example, the electrical interface between a controller and memory elements remains a significant limiting factor for memory performance.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1A:
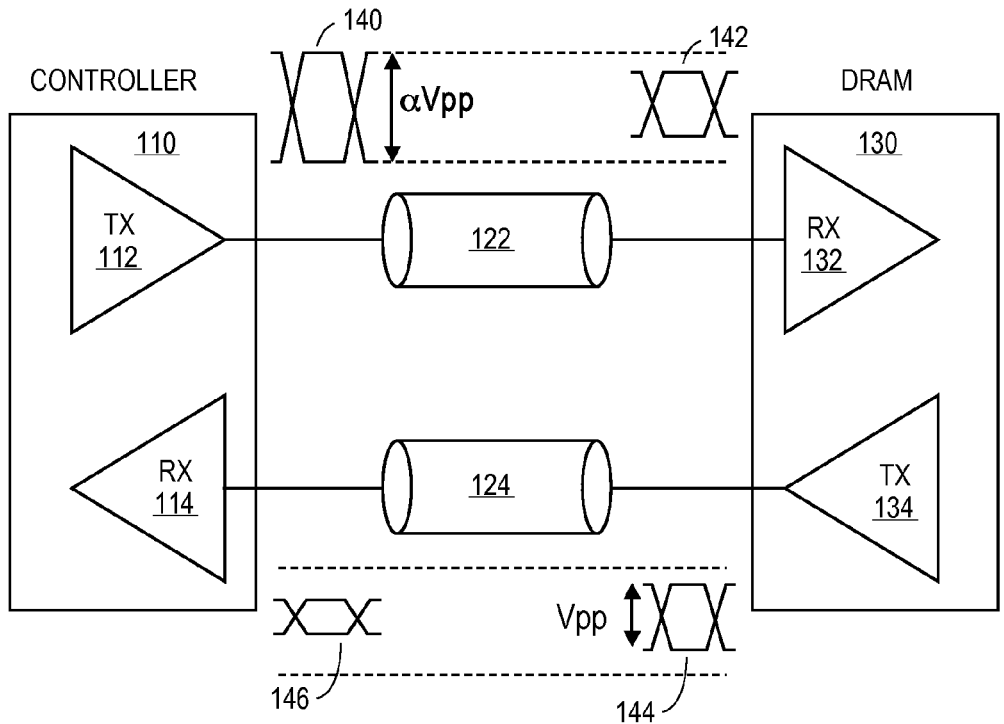
FIG. 1A illustrates an embodiment of an apparatus or system with unidirectional I/O interface having asymmetric voltage swing between connected integrated circuits.

Embodiments of the invention are generally directed to an interfacing between integrated circuits with asymmetric voltage swing.

In a first aspect of the invention, an embodiment of an apparatus includes a first integrated circuit including a first transmitter and a first receiver; a second integrated circuit including a second transmitter and a second receiver; and an interface including communication channel linking the first transmitter with the second receiver and the first receiver with the second transmitter, wherein the communication channel is one of a single channel or a dual channel. The first transmitter is operable to transmit a first signal and the second transmitter is operable to transmit a second signal, a first average voltage swing of the first signal being asymmetric with a second average voltage swing of the second signal.

In a second aspect of the invention, an embodiment of a method includes establishing a first voltage swing for transmission from a first integrated circuit, the first integrated circuit including a first transmitter and a first receiver, to a second integrated circuit, the second integrated circuit including a second transmitter and a second receiver; establishing a second voltage swing for transmission from the second integrated circuit to the first integrated circuit; transmitting a first signal from the first transmitter to the second receiver using the first voltage swing; and transmitting a second signal from the second transmitter to the first receiver using the second voltage swing, wherein the first voltage swing and the second voltage swing are asymmetric.

DETAILED DESCRIPTION

Embodiments of the invention are generally directed to interfacing between integrated circuits with asymmetric voltage swing.

In some embodiments, a memory interface utilizes asymmetric voltage swings at a controller transmitter and at a memory transmitter. In some embodiments, a larger voltage swing is established for transmission from the controller to the memory than a voltage swing established from the memory to the controller.

Devices such as dynamic random access memory (DRAM) are commonly slower (which may be by an order of two) than their counterparts in the controller of a memory interface, due to the fact that the transistors in the DRAM process have larger threshold voltages than their counterparts in the controller. In addition, the fact that only lower metal layers are available in the DRAM process means more parasitic capacitance and resistance are introduced that, accordingly, makes the routing and design process in memory more complicated and slower than in the controller.

In some embodiments, an asymmetric-swing memory interface is applied to address issues regarding the interfacing between controller and memory. In some embodiments, in an asymmetric swing architecture, the controller circuitry is responsible for the majority of equalization, detection and timing duties. The responsibility is placed in the controller because devices in the controller generally have higher transit frequency and lower threshold voltages than memory, which consequently makes analog and digital design in the controller more power efficient in comparison with DRAM.

Analysis of CMOS circuits for high-speed communication links shows that CMOS technology performance metrics can directly influence link characteristics. An inferior CMOS process will significantly manifest itself in the receiver sensitivity. In some embodiments, in the downstream (controller to DRAM) bit-stream, in order to satisfy the link BER (bit error rate) performance and compensate for impaired receiver sensitivity, the signal to noise ratio (SNR) at the receiver of the memory side of an interface may be increased, where the higher SNR may be provided by boosting the signal swing at the transmitter side. The same types of factors are at issue in the uplink (DRAM to controller) bit-stream, where receiver sensitivity can be improved by taking advantage of higher quality CMOS process. In some embodiments, the receiver sensitivity of the controller allows the DRAM transmitter driver signal swing to be lowered for power efficiency purposes.

In some embodiments, packaging technology may vary between devices, such as between controller and memory, a controller having a first packaging technology and the memory having a second packaging technology. In some embodiments, a controller may include an SoC (System on Chip) with, for example, flip-chip packaging and a DRAM with, for example, wire bonding, where packaging technology of the SoC allows for lower signal voltage operation than the DRAM. The DRAM may include higher inductances, capacitances and resistances than the SoC, thus having more loss and ISI (Interfering Switching Inputs) effects in the packaging and requiring a higher received signal voltage. The DRAM transmitter when transmitting using lower swing signal can reduce the effect of SSO (Simultaneous Switching Outputs) in the DRAM packaging and provide better signaling at the SoC receiver.

In some embodiments, in order to take advantage of faster technology and lower threshold voltage in a controller in comparison with DRAM, the signal swing at the output of the controller transmitter driver may be chosen to be higher than signal swing at the output of the transmitter at the DRAM side, which typically has slower technology and higher $V_{TH}$ (threshold voltage) voltage values. In some embodiments, an increase in voltage swing from controller to memory and a decrease in voltage swing from memory to controller may be utilized to improve performance while potentially reducing overall power consumption.

In some embodiments, a voltage supply difference between a controller and a memory may enable asymmetric voltage swing operation in order to improve power dissipation overall. In an example, the supply voltage for a DRAM may be 1.2 volts and the supply voltage of an SoC may be 0.9 volts, and, with similar swings at the SoC and the DRAM, in the terminated situation on both sides of the link this will result in about (1.2/0.9)=1.3 times more power on the DRAM side than the SoC side. If dynamic power dissipated is considered, this difference is even larger. In some embodiments, by having an asymmetrical swing, where there is a greater signal swing on the SoC transmitter compared to the DRAM transmitter, the overall power dissipation of the link can be reduced.

FIG. 1A illustrates an embodiment of an apparatus or system with unidirectional I/O interface having asymmetric voltage swing between connected integrated circuits. The apparatus or system may include, for example a memory device 100 with an I/O interface between a memory controller 110 and a DRAM memory 130. In the illustrated memory device 100, the controller 110 is coupled with the DRAM 130, where a transmitter (TX) 112 of the controller 110 is coupled via a first unidirectional channel 122 of a dual communication channel of the memory I/O interface with a receiver (RX) 132 of the DRAM 110 and a transmitter 134 of the DRAM 130 is coupled via a second unidirectional channel 124 of the dual communication channel with a receiver 114 of the controller 110. In some embodiments, the interface including first channel 122 and second channel 124 may vary in different implementations, and may include, for example, either single-ended channels or differential channels, and either unidirectional channels or bidirectional channels. In some embodiments, the controller 110 is a device such as a system on chip (SoC) with faster performance and more sensitivity that can tolerate lower signal voltages in comparison with the memory 130, while the memory 130 is a DRAM that requires higher signal voltages in comparison with the controller. In some embodiments, coding of signal may include non-return to zero encoding in which each binary signal has a non-zero potential, such as a '1' being represented by a positive voltage and a '0' signal being represented by negative voltage.

In this illustration, the controller 110 provides a signal 140 with a particular voltage swing indicated as αV peak-peak swing to be transmitted through the channel 122, with the signal 142, as attenuated by the channel 122, at the receiver 132 of the DRAM 130. On the DRAM end, the transmitter 134 of the DRAM transmits a signal 144 with Vpp (peak-to-peak) swing through the second channel 124, with the signal 146, as attenuated by the channel, being received at the receiver 114 of the controller 110.

In some embodiments, the voltage swing αV for the signal transmission from controller 110 to DRAM 130 is not equal to the voltage swing V for the signal transmission from DRAM 130 to controller 110. In some embodiments, α>1.0, thus providing a greater voltage swing from the controller to the memory than the voltage swing from the memory to the controller.

Figure 1B:
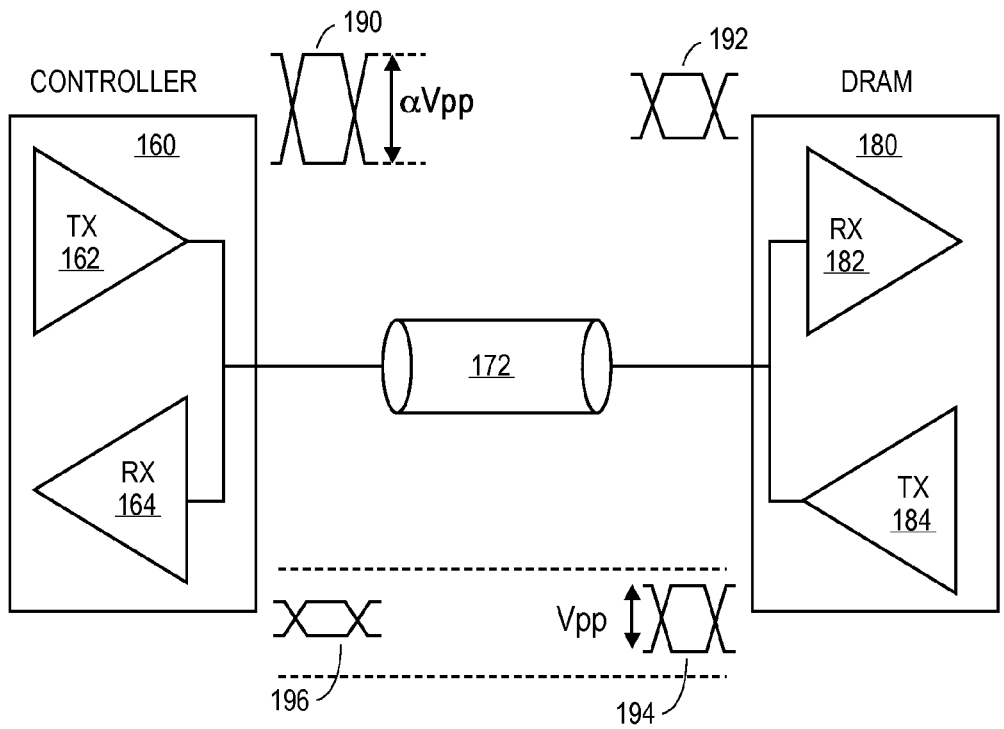
FIG. 1B illustrates an embodiment of an apparatus or system with bidirectional I/O interface having asymmetric voltage swing between integrated connected integrated circuits.

FIG. 1B illustrates an embodiment of an apparatus or system with bidirectional I/O interface having asymmetric voltage swing between integrated connected integrated circuits. In the embodiment illustrated in FIG. 1B, a memory device 150 includes a controller 160 coupled with a DRAM 180, where a transmitter 162 of the controller 160 is coupled to a bidirectional channel 172 of the memory I/O interface for transmission of signals to a receiver 182 of the DRAM 180, and a transmitter 184 of the DRAM 180 is coupled to the same bidirectional channel 172 for transmission of signals to receiver 164 of the controller 160. In some embodiments, the controller 160 again is a device such as an SoC with faster performance and more sensitivity that can tolerate lower signal voltages in comparison with the memory 180, and the memory 180 is a DRAM that requires higher signal voltages in comparison with the controller.

In FIG. 1B, the controller 160 provides a signal 190 with a particular voltage swing indicated as αV peak-peak swing to be transmitted through the channel 172, with the signal 192, as attenuated by the channel 172, at the receiver 182 of the DRAM 180. On the DRAM end, the transmitter 184 of the DRAM transmits a signal 194 with Vpp swing through the same channel 172, with the signal 196, as attenuated by the channel, being received at the receiver 164 of the controller 160. As with the embodiment shown in FIG. 1A, the voltage swing αV illustrated in FIG. 1B for the signal transmission from controller 160 to DRAM 180 is not equal to the voltage swing V for the signal transmission from DRAM 180 to controller 160, with α>1.0, thus providing a greater voltage swing from the controller to the memory than the voltage swing from the memory to the controller.

Figure 2A:
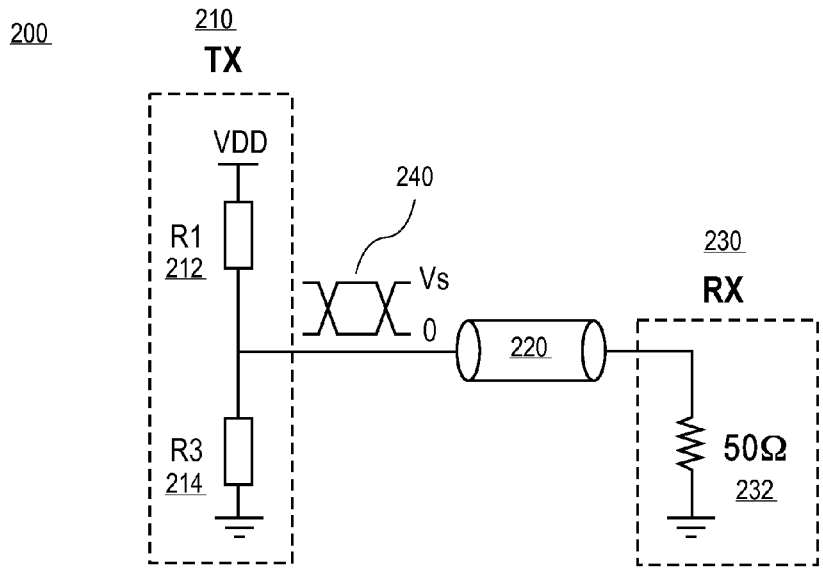
FIG. 2A is an illustration of a simplified voltage-division single-ended driver.

FIG. 2A is an illustration of a simplified voltage-division single-ended driver. In this illustration, a device 200 includes a driver (TX) 210, where the driver is shown as including resistances R1 212 and R3 214 in series between power supply voltage VDD and ground, providing a voltage division at a node between R1 and R3. The node between R1 212 and R3 214 is coupled with a channel 220 for the transmission of a signal 240 to be received a receiver 230, shown as including a resistance 232 that is shown as having a value of 50 ohms. To match impedances, the resistance of R1 in parallel with R3 will be 50 ohms.

Figure 2B:
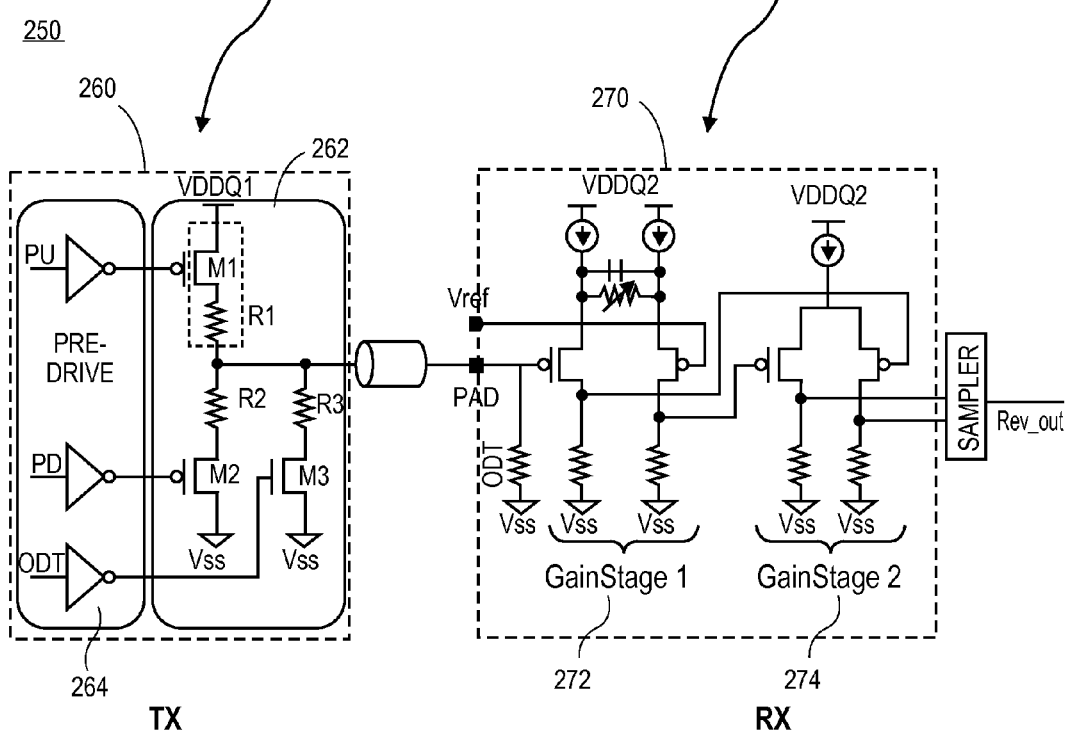
FIG. 2B illustrates driver and receiver structures that are used for power analysis.

FIG. 2B illustrates driver and receiver structures that are used for power analysis. In FIG. 5B, a driver 260 consists of an output stage 262 and pre-drive stage 264, where the pre-drive stage drives PU (pull up), PD (pull down), and ODT (on die termination) signals. A differential receiver 270 consists of 2 gain stages, GainStage 1 272 and GainStage 2 274, with equalization, wherein the sampler is included for completeness and is not considered in receiver power analysis. The PU signal operates to switch transistor M1 to enable or disable pull up resistor R1, and the PD signal operates to switch transistor M2 to enable or disable pull down resistor R2. The ODT signal controlling transistor M3 is intended to enable or disable the R3 leg, which may or may not switch as per the input data signal as is the case with PU/PD signals.

In FIG. 2A, the driver 210 creates the signal 240 representing a bit "1" with signal amplitude of $V_{swing}$. Because the driver 210 ideally does not draw any current from the VDD power supply during bit "0", a power calculation may only consider the bit "1" as the power consumption state. From FIG. 2A, power may be calculated by the product of the VDD and the amount of the DC current drawn from VDD during bit "1". Substituting values for $V_{swing}$ and the impedance of R1 and R2 in parallel, an expression for the value of average DC power may be determined as follows:

$$V_{swing} = V_{DD} \times \frac{R_2 \| 50}{R_1 + R_2 \| 50} \quad [1]$$

$$R_1 \| R_2 = 50 \quad [2]$$

$$\text{Average DC Power} = \frac{1}{2} \times \frac{V_{DD}^2}{R_1 + R_2 \| 50} \quad [3]$$

The ½ factor in equation [3] is based on an assumption that the probability of an occurrence of bit "1" is 0.5. By elaborating equations [1] to [3], average power may be represented in terms of $V_{DD}$ and $V_{swing}$:

$$\text{Average DC Power} = \frac{1}{2} \times \frac{(V_{DD} - V_{swing}) \cdot V_{swing}}{25} \text{ for } V_{swing} < \frac{V_{DD}}{2} \quad [4]$$

The condition $$V_{swing} < \frac{V_{DD}}{2}$$

is derived from the fact that both sides of the channel have ideally 50Ω terminations.

The TX average total power includes TX average DC power and TX average AC power, where the TX average AC power is determined by:

$$\text{Average AC Power} = Ci * V\text{swing}^2 * f + Cp * V\text{swing}^2 * f \quad [5]$$

Where Ci is driver internal capacitance, Cp is pad capacitance of both driver and input receiver load, Vswing is output average output swing voltage, and f is average frequency of data signal.

The TX average total power therefore is:

$$\text{TX Average Total Power} = \text{TX Average DC Power} + \text{TX Average AC Power} \quad [6]$$

At 4 Gbps data rate, the TX average DC power contributes 80% of total power and the TX average AC power contributes 20% of total power.

Figure 3:
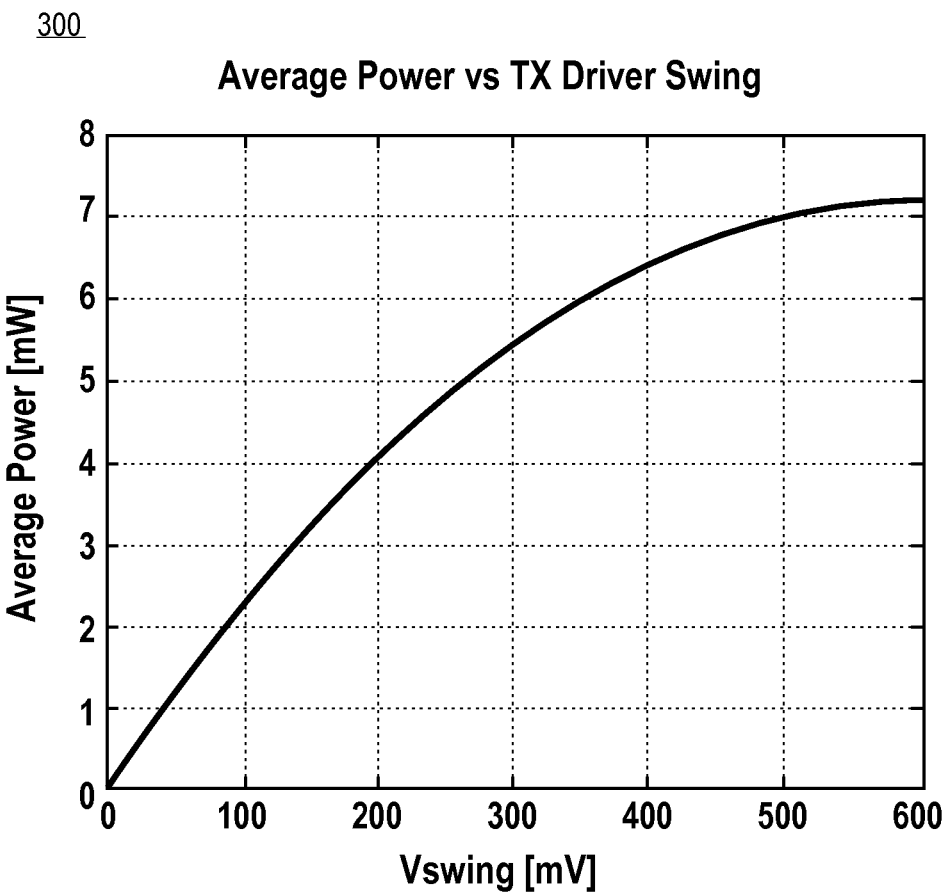
FIG. 3 shows the average power as a function of voltage swing for different swing conditions.

FIG. 3 shows the average power as a function of voltage swing for different swing conditions. In some embodiments, a graph 300 plots average power consumption versus desired TX driver signal swing. As shown in FIG. 3, power increases non-linearly, by signal swing in a squared fashion. For example, if the swing at a TX driver is halved from 400 mV to 200 mV, average power consumption at the driver will drop from 6.4 mW to 4 mW.

Figure 4A:
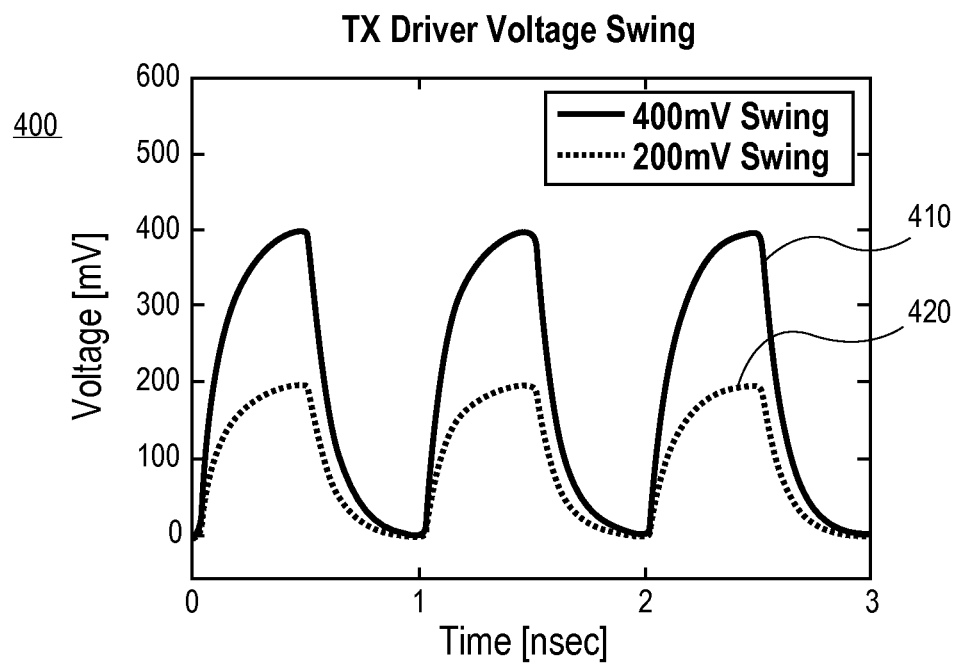
FIG. 4A is a graph to illustrate a time domain representation of transmitter driver output.
Figure 4B:
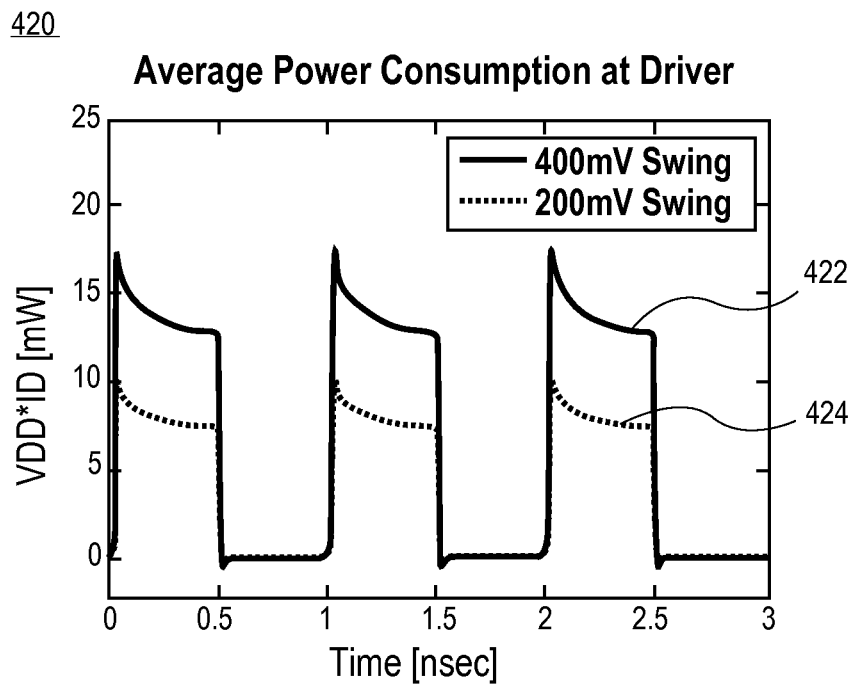
FIG. 4B is a graph to illustrate and instantaneous power consumption on a power supply over time.

FIG. 4A is a graph to illustrate a time domain representation of transmitter driver output, and FIG. 4B is a graph to illustrate and instantaneous power consumption on a power supply over time. FIG. 4A illustrates a typical TX driver output for two different swing conditions, while FIG. 4B shows the instantaneous power for the respective swings. FIG. 4A illustrate a voltage curve 400 (in millivolts) over time (in nanoseconds) for particular voltage swing values for a transmitter driver, the swing voltage value being 400 mV for the upper curve 412 and 200 mV for the lower curve 414. FIG. 4B illustrates a curve 420 of instantaneous power consumption versus time the swing voltage value being 400 mV for the upper curve 422 and 200 mV for the lower curve 424.

Figure 4C:
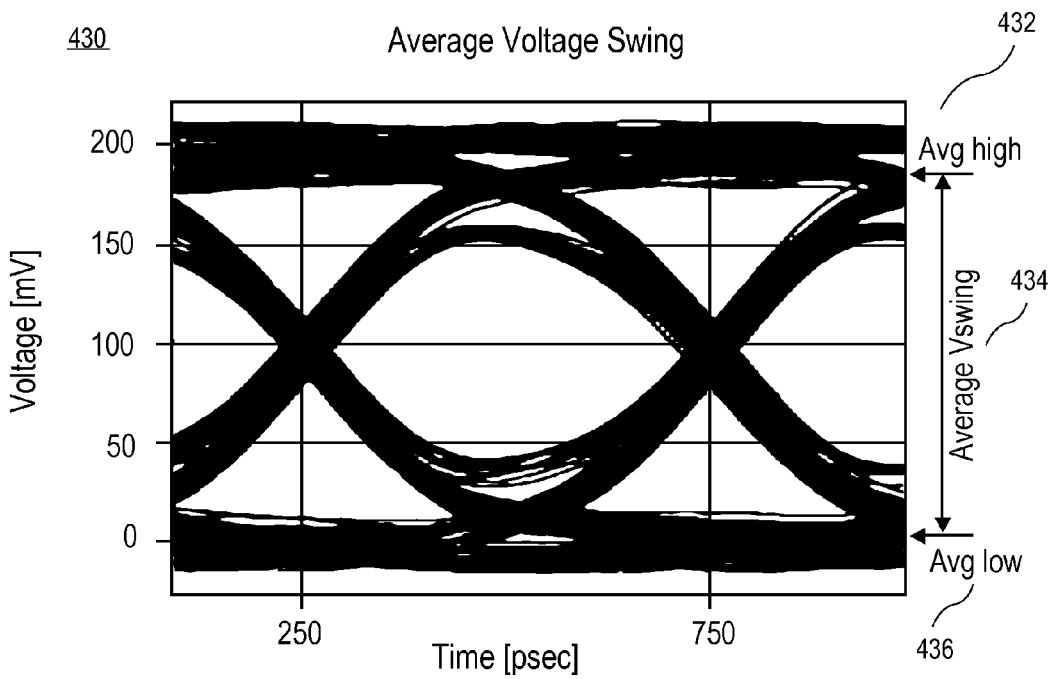
FIG. 4C illustrates an eye diagram including average high, average low and average voltage swing parameters.
Figure 4D:
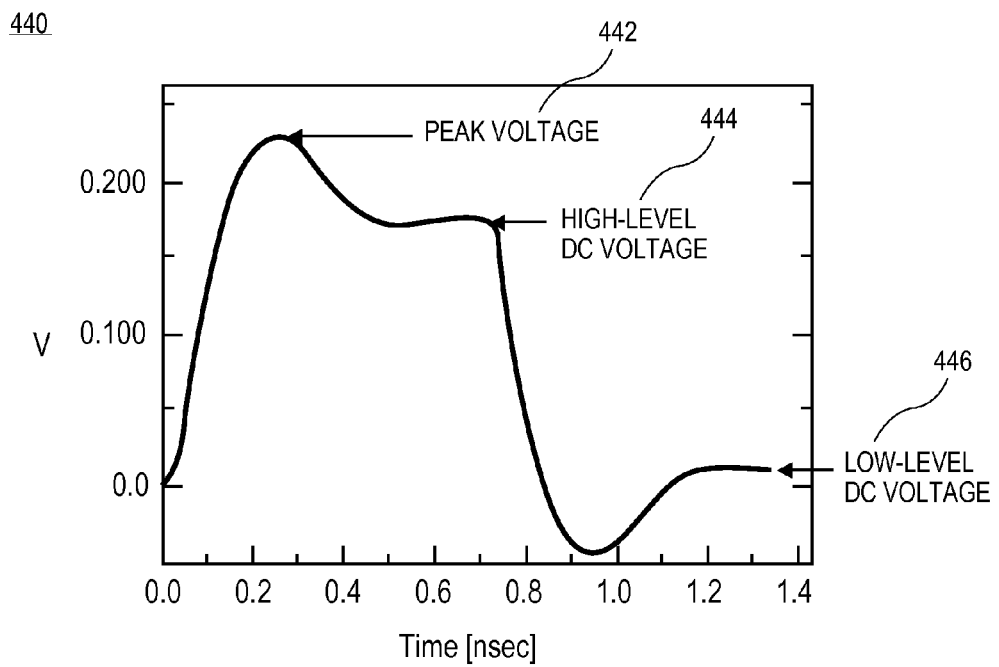
FIG. 4D illustrates a time domain waveform of the output signal with definition for peak high, peak low voltages with DC high value and DC low value.

FIG. 4C illustrates an eye diagram including average high, average low and average voltage swing parameters, and FIG. 4D illustrates a time domain waveform of the output signal with definition for peak high, peak low voltages with DC high value and DC low value. FIG. 4C includes an "average Vswing" parameter 434, which is defined herein as the average "high" value 432 in the case of output of a single-ended driver referenced to ground and the peak-peak value that is referenced to average "low" value 436 in case of differential signals. The eye diagram illustrated in the driver output 430 includes instantaneous values in and around the center that are usually different from a DC value due to the transients associated with the non-ideal nature of the driver and its interconnect. If a driver output remains at a high level for an infinite amount of time the output value would reach the steady state DC voltage value, which would ideally be the high-level DC voltage. FIG. 4D shows voltage over time for a device. Depending on the parasitic resistances in the driver, receiver, and the interconnect, as illustrated in FIG. 4D, after a certain amount of time, the output would reach the DC voltage value, the value being either the high-level DC voltage 444 or and the -level low DC voltage 446.

In some embodiments, it is also possible to reference the output driver voltage to VDD instead of ground (zero). In that case, the low-level DC voltage would be higher than zero and the high-level DC voltage would be close to VDD (VDDQ1 or VDDQ2, as illustrated in FIG. 2B). In some embodiments, a driver output may be referenced to low supply, wherein signal levels are referenced to ground (zero); may be referenced to high supply, wherein signal levels are referenced to a supply voltage (VDD); or may be referenced to combination of both low supply and high supply, wherein signal levels do not relate to either the low or high value.

In some embodiments, a higher voltage swing at a controller transmitter and lower voltage swing at a DRAM transmitter also allows the receiver block at the DRAM to be designed with more relaxed requirements, providing a lower sensitivity, compared to the receiver at the controller. Such an implementation may be utilized to achieve a power efficient link design because of access to a better circuit process at the controller together with lower power consumption in the DRAM receiver block.

In some embodiments, the output of a driver may be substantially equal to a supply voltage of one or more supply voltages supplied to the transmitter, the transmitter thus utilizing a full voltage swing based on such supply voltage.

Figure 5A:
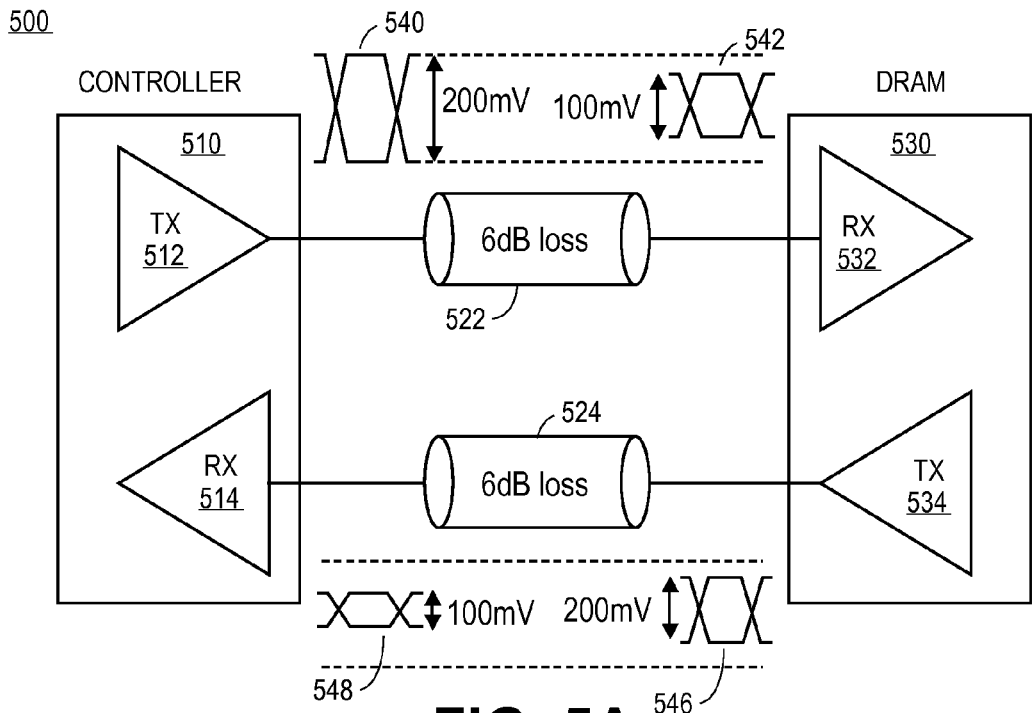
FIG. 5A illustrates a memory interface with a symmetric swing.
Figure 5B:
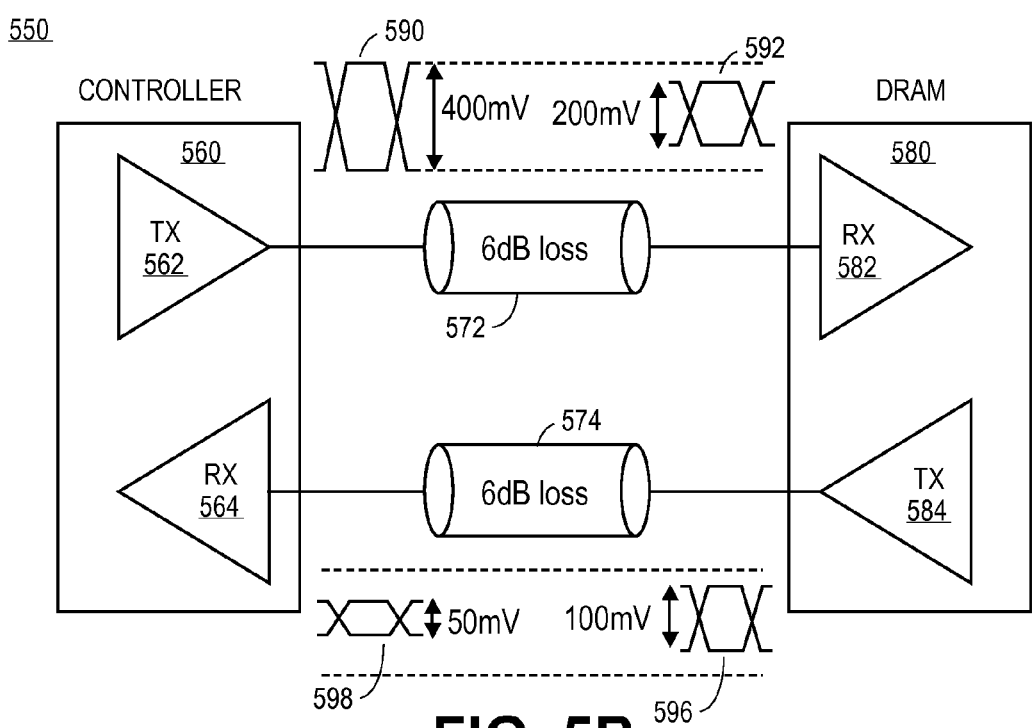
FIG. 5B illustrates an embodiment of a memory interface with an asymmetric voltage swing.

For comparison of power savings, FIG. 5A illustrates a memory interface with a symmetric swing, and FIG. 5B illustrates an embodiment of a memory interface with an asymmetric voltage swing.

In FIG. 5A, a memory device 500 includes a controller 510 coupled with a DRAM 530, a transmitter 512 of the controller 510 being coupled via first channel 522 with receiver 532 of the DRAM 530, and transmitter 534 of the DRAM 530 being coupled via second channel 524 with receiver 514 of the controller 510. While two channels are illustrated here, in another implementation there may be a single channel for transmission between devices. With the channel 522 and channel 524 assumed to provide 6-decibel loss in the average swing of a signal transmitting through the channel, due to limited sensitivity and equalization level of receiver 532 of the DRAM 530, the transmitter 512 of the controller 510 needs to transmit a large enough signal swing to compensate for the channel loss and provide a sufficient signal at the receiver 532. With a symmetric swing interface, the transmitter 534 of the DRAM 530 also transmits the same increased signal swing to the controller receiver 514 of the controller 510, these signals resulting in increasing power consumption in both the controller side and the DRAM side. In this illustration, the controller 510 provides a signal 540 with voltage swing of 200 mV, which is received at the DRAM as a signal 542 with a voltage swing of 100 mV. The DRAM 530 transmits symmetric signal 546 with voltage swing 200 mV, which is received at the controller 510 as signal 548 with voltage swing 100 mV.

In FIG. 5B, an embodiment of a memory device 550 includes a controller 560 coupled with a DRAM 580, a transmitter 562 of the controller 560 being coupled with receiver 582 of the DRAM 580 via first channel 572, and transmitter 584 of the DRAM 580 being coupled with receiver 564 of the controller 560 via second channel 574. In FIG. 5B, channel 572 and channel 574 are again assumed to provide 6-decibel loss in average swing of a signal transmitting through the channels. In some embodiments, the memory device provides an increased voltage swing from the controller to provide improved performance at the memory, while providing a decreased voltage swing from the DRAM to reduce power while taking advantage of the better sensitivity of the controller. In this illustration, the controller 560 provides a signal 590 with voltage swing of 400 mV, which is received at the DRAM as a signal 592 with a voltage swing of 200 mV. The DRAM 580 transmits an asymmetric signal 596 with voltage swing 100 mV, which is received at the controller 590 as signal 598 with voltage swing 50 mV. In this illustration, α=4.0.

To estimate the amount of power saving for a representative I/O link using asymmetric swing, such as a comparison between the circuit operation shown in FIG. 5A and the circuit operation shown in FIG. 5B, certain assumptions may be made:

(1) The DRAM circuitry and the controller circuitry are assumed to be supplied by 1.2 V and 0.9 V voltages, respectively.

(2) The controller has native 0.9V transistors in 28 nm process technology, while the DRAM has 1.2V thicker oxide transistors in 40 nm process technology.

(3) The pad capacitance (Cp) is 2 picofarads total, and the internal driver capacitance (Ci) is 0.4 picofarad.

(4) In a symmetric scenario, such as illustrated in FIG. 5A, power consumption at the receiver and transmitter are the same and equal to a value "P".

(5) Reported power values are derived by simulating operation at a data rate of 4 Gb/s.

In such an estimate, a determination is made regarding an amount of power that is necessary in order for the controller process and DRAM process to meet certain specifications such as sensitivity and drivability. In this estimate, the differential pair amplifier that drives a capacitor and amplifies the input signal by 6 dB, using equations [4], [5] and [6], results in a TX average DC power consumption for a typical DRAM process that is 1.43 times greater than DC power consumption at the controller process. The internal capacitance (Ci) of DRAM process technology is 1.5 times the internal capacitance of controller process technology, and the resulting TX average AC power consumption in a typical DRAM process is 2.4 times greater than power consumption in the controller process. Therefore, the TX average total power consumption in a typical DRAM process is 1.43*0.8+2.4*0.2=1.624 times greater than average total power consumption at the controller process.

In the asymmetric scenario, illustrated in the embodiment of FIG. 5B, power at the controller transmitter 562 of FIG. 5B is increased by 1.6 times in comparison with transmitter 512 of FIG. 5A to increase the output voltage swing from 200 mV to 400 mV. However, at the DRAM transmitter 584 of FIG. 5B, power is reduced by a factor of 0.55 in comparison with transmitter 534 of FIG. 5A because the output voltage swing is halved from 200 mV to 100 mV.

As the embodiment is illustrated in FIG. 5B, a reduced voltage swing of 100 mV at the DRAM transmitter 584 requires that the receiver 564 of the controller 560 is capable of detecting the signal with 50 mV swing. In some embodiments, the amplifier stage at the receiver 564 of controller 560 is doubled in comparison with receiver 514 of FIG. 5A. As illustrated in FIG. 2B, in a receiver 270 that has 2 stages, the first gain stage is mainly for common mode gain and equalization of the input signal and the second stage provides the signal gain. With input swing reduced to half from 100 mV to 50 mV, more gain needs to be put into the differential gain stage, and, with the faster process of the controller and with the presence of the common mode gain stage, the extra gain in the differential gain stage translates to approximately 1.5 times more in total power consumption at the controller receiver 564 in comparison with receiver 514. However, the increased voltage signal 592 at the DRAM receiver 582 has a reduced sensitivity requirement and therefore the common mode gain stage can be eliminated while the differential gain stage has less gain required. By eliminating one gain stage the power is scaling by half. The power in the receiver remaining gain stage consists of 85% of DC gain power and 15% AC power. With limited headroom in operating of the DRAM receiver due to the slower process of the DRAM, the DC power scales by squared of V-swing of the input signal while the AC power is very much independent of input V-swing, given the assumption that the output swing of the gain stage before going to the sampler is the same. The total DRAM RX power scaling will be:

$$\text{Average DRAM RX Power Scaling} = 2 + (0.85 * 2^2) + (0.15 * 1) \qquad [7]$$

In Equation [7], the first term is a power factor resulting from eliminating one gain stage from the receiver, the second term is DRAM receiver DC power scaling due to input voltage swing, and the last term is the DRAM receiver AC power scaling. Equation [7] provides that average DRAM receiver power is 5.55 times less than the power consumption at the DRAM receiver 582 in comparison with DRAM receiver 532.

The power performance for the asymmetric operation of the I/O link in FIG. 5B in comparison with the symmetric operation of the I/O link in Figure is summarized in Table 1. As shown, in this example the total power is reduced by approximately 20% from 5.248×P to 4.28×P.

TABLE 1

Total Power Performance of Memory I/O Link

|  | Controller | | DRAM | | Total Power of Controller and DRAM |
| --- | --- | --- | --- | --- | --- |
|  | $P_{TX}$ | $P_{RX}$ | $P_{TX}$ | $P_{RX}$ | $(P_{TX} + P_{RX})$ |
| Symmetric | P | P | 1.624 × P | 1.624 × P | 5.248 × P |
| Asymmetric | 1.6 × P | 1.5 × P | 0.89 × P | 0.29 × P | 4.28 × P |

Greater or smaller power savings may be achieved with asymmetric signal swing operation depending on the technologies present in each of the link integrated circuits.

Figure 6:
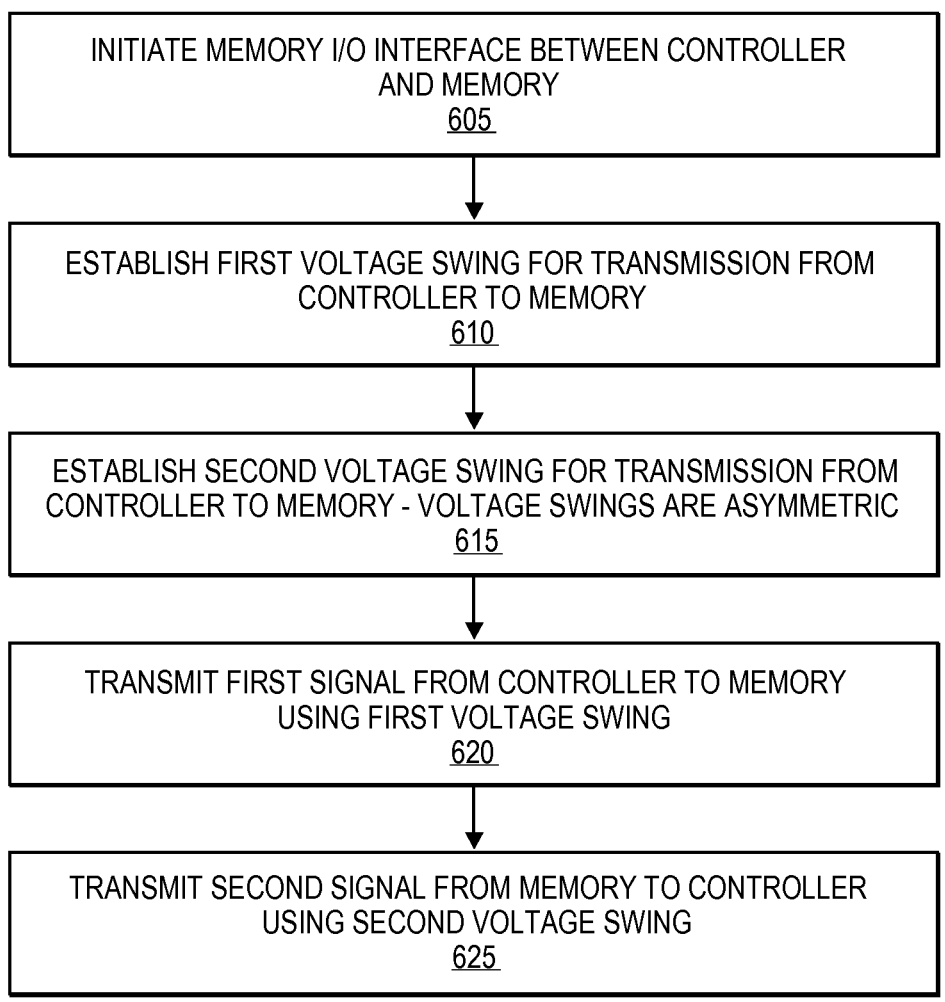
FIG. 6 is a flowchart to illustrate an embodiment of a process for memory operation with asymmetric voltage swing operation.

FIG. 6 is a flowchart to illustrate an embodiment of a process for memory operation with asymmetric voltage swing operation. While FIG. 6 provides a method 600 for a specific implementation of a memory interface, embodiments are not limited to this implementation. In some embodiments, a memory I/O interface between a controller and a memory is initiated or operation is otherwise commenced 605. In some embodiments, a first voltage swing is established for transmission from the controller to the memory 610, and a second voltage swing is established from transmission from the memory to the controller, where the second voltage swing and first voltage swings are asymmetric 615. In some embodiments, the first and second voltage swings are established at levels dependent on the technologies of the connected integrated circuits. In the example of the controller coupled with the memory via the I/O interface, voltages may be established to provide a higher voltage swing for the transmission of a signal from the controller to the memory in comparison with the voltage swing from the memory to the controller, such as illustrated in FIG. 5B. In some embodiments, a first signal is transmitted from the controller to the memory using the first voltage swing 620, and a second signal is transmitted from the memory to the controller using the second voltage swing 625. In some embodiments, the transmission of the first signal using the first voltage swing and the second signal using the second voltage swing may provide for reduced power consumption and improved operation in comparison with a symmetric voltage swing operation by taking advantage of, for example, of lower voltage requirements at the controller compared with the memory allowing for a reduced swing from memory to controller, together with improved operation at the memory resulting from an increased voltage swing from controller to memory.

Although embodiments generally described herein are described with relation to a memory controller and memory interface, embodiments are not limited to this implementation and may include other interfaces where the interfacing chips have different process implementations, including implementation in which the chips have unique limitations in terms of overall performance with respect to speed and power dissipated. For example, the description may include an interface where a processor is connected to a modem base-band chip in a mobile platform.

In some embodiments, the driver and receiver implementations may be different than as illustrated and described herein. However, in that case the power benefit could either be higher or lower than the example embodiment shown above in Table 1.

Figure 7:
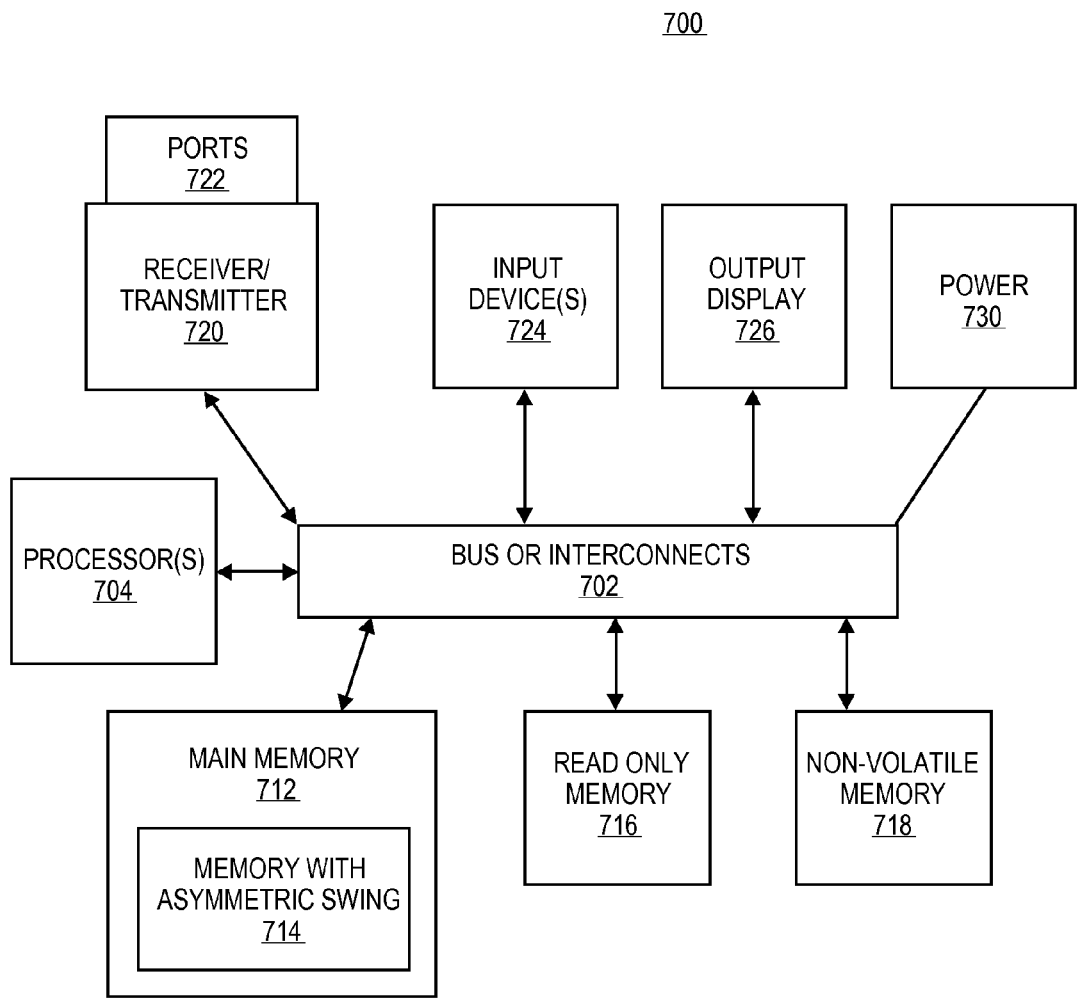
FIG. 7 is an illustration of an apparatus or system including a memory with asymmetric voltage swing.

FIG. 7 is an illustration of an apparatus or system including a memory with asymmetric voltage swing. In this illustration, certain standard and well-known components that are not germane to the present description are not shown. In some embodiments, the apparatus or system 700 (referred to here generally as an apparatus) comprises a bus or interconnects 702 or other communication means for transmission of data. The apparatus 700 may include a processing means, such as one or more processors 704 coupled with the interconnect 702 for processing information. The processors 704 may comprise one or more physical processors and one or more logical processors. The bus or interconnect 702 is illustrated as a single interconnect for simplicity, but may represent multiple different interconnects or buses and the component connections to such interconnects may vary. The interconnect 702 shown in FIG. 7 is an abstraction that represents any one or more separate physical buses, point-to-point connections, or both connected by appropriate bridges, adapters, or controllers.

In some embodiments, the apparatus 700 further comprises a random access memory (RAM) or other dynamic storage device or element as a main memory 712 for storing information and instructions to be executed by the processors 704. RAM memory may include dynamic random access memory (DRAM). In some embodiments, memory of the apparatus may further include certain registers or other special purpose memory.

In some embodiments, the main memory 712 may include memory 714 utilizing asymmetric voltage swing, where the memory 714 provides a larger voltage swing between the controller and memory than voltage swing between the memory and the controller. In some embodiments, the asymmetric voltage swing of the memory 714 may be utilized at least in part to improve performance of the apparatus 700, reduce power consumption of the apparatus 700, or both. In some embodiments, asymmetric voltage swing may additionally or alternatively be implemented in other interfaces between integrated circuits. In some embodiments, the voltage swings are established to meet the specifications the controller and the memory.

The apparatus 700 may include a read only memory (ROM) 716 or other static storage device for storing static information and instructions for the processors 704. The apparatus 700 may include one or more non-volatile memory elements 718 for the storage of certain elements, including, for example, flash memory, hard disk drive, or solid-state drive.

One or more transmitters or receivers 720 may also be coupled to the interconnect 702. In some embodiments, the receivers or transmitters 720 may be coupled to one or more ports 722, where the ports may include, for example, one or more HDMI™ (High-Definition Multimedia Interface) ports, and one or more MHL™ (Mobile High-Definition Link) ports.

In some embodiments, the apparatus 700 includes one or more input devices 724, where the input devices include one or more of a keyboard, mouse, touch pad, voice command recognition, gesture recognition, or other device for providing an input to a computing system.

The apparatus 700 may also be coupled via the interconnect 702 to an output device 726. In some embodiments, the display 726 may include a liquid crystal display (LCD) or any other display technology, for displaying information or content to a user. In some environments, the display 726 may include a touch-screen that is also utilized as at least a part of an input device. In some environments, the display 726 may be or may include an audio device, such as a speaker for providing audio information.

The apparatus 700 may also comprise a power device or apparatus 730, which may comprise a power supply, a battery, a solar cell, a fuel cell, or other system or device for providing or generating power. The power provided by the power device or system 730 may be distributed as required to elements of the apparatus 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable or machine-readable storage medium, including a non-transitory medium, having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

In some embodiments, an apparatus includes a first integrated circuit including a first transmitter and a first receiver; a second integrated circuit including a second transmitter and a second receiver; and an interface including communication channel linking the first transmitter with the second receiver and the first receiver with the second transmitter, wherein the communication channel is one of a single channel or a dual channel. In some embodiments, the first transmitter is operable to transmit a first signal and the second transmitter is operable to transmit a second signal, a first average voltage swing of the first signal being asymmetric with a second average voltage swing of the second signal.

In some embodiments, the first transmitter is one of a single-ended transmitter or a differential transmitter.

In some embodiments, the first transmitter output is referenced either to low supply wherein a signal reference is to ground, to high supply wherein a signal reference is to a supply voltage, or to a combination of both low supply and high supply.

In some embodiments, an output of the first transmitter includes non-return to zero (NRZ) coding.

In some embodiments, one of the first transmitter's outputs is substantially equal to a supply voltage of one or more supply voltages supplied to the transmitter.

In some embodiments, the first integrated circuit includes a memory controller and wherein the second integrated circuit includes a memory. In some embodiments, the memory is a dynamic random access memory (DRAM), and the memory controller is a system on chip (SoC).

In some embodiments, the first receiver of the first integrated circuit has greater signal sensitivity than the second receiver of the second integrated circuit.

In some embodiments, a supply voltage of the first integrated circuit is smaller than a supply voltage of the second integrated circuit.

In some embodiments, a method includes establishing a first voltage swing for transmission from a first integrated circuit, the first integrated circuit including a first transmitter and a first receiver, to a second integrated circuit, the second integrated circuit including a second transmitter and a second receiver; establishing a second voltage swing for transmission from the second integrated circuit to the first integrated circuit; transmitting a first signal from the first transmitter to the second receiver using the first voltage swing; and transmitting a second signal from the second transmitter to the first receiver using the second voltage swing. In some embodiments, the first voltage swing and the second voltage swing are asymmetric.

In some embodiments, the first integrated circuit includes a memory controller and wherein the second integrated circuit includes a memory.

In some embodiments, establishing the first voltage swing includes establishing a signal swing that is sufficient to meet specifications of the second integrated circuit after attenuation by a communication channel between the first transmitter and the second receiver; and establishing the second voltage swing includes establishing a signal swing that is sufficient to meet specifications of the first integrated circuit after attenuation by a communication channel between the second transmitter and the first receiver.

In some embodiments, the communication channel between the first transmitter and the second receiver is a first channel of a dual communication channel and the communication channel between the second transmitter and the first receiver is a second channel of the dual communication channel.

In some embodiments, the communication channel between the first transmitter and the second receiver is the same as the communication channel between the second transmitter and the first receiver.

In some embodiments, the first receiver has greater signal sensitivity than the second receiver.

In some embodiments, a system includes a processor for processing data; a memory controller including a first transmitter and a first receiver; a DRAM for storage of data, the DRAM including a second transmitter and a second receiver; and an interface between the memory controller and the DRAM including a communication channel linking the first transmitter with the second receiver and the first receiver with the second transmitter. In some embodiments, the first transmitter is operable to transmit a first signal and the second transmitter is operable to transmit a second signal, a first average voltage swing of the first signal being asymmetric with a second average voltage swing of the second signal.

In some embodiments, the memory controller of the memory device is an SoC. In some embodiments, the first receiver of the controller has greater signal sensitivity than the second receiver of the DRAM.

In some embodiments, a computer-readable storage medium has stored thereon data representing sequences of instructions that, when executed by a processor, cause the processor to perform operations comprising: establishing a first voltage swing for transmission from a memory controller, the first memory controller including a first transmitter and a first receiver, to a memory, the memory including a second transmitter and a second receiver, via an I/O (input/output) interface; establishing a second voltage swing for transmission from the memory to the memory controller; transmitting a first signal from the first transmitter to the second receiver using the first voltage swing; and transmitting a second signal from the second transmitter to the first receiver using the second voltage swing. In some embodiments, the first voltage swing of the memory controller and the second voltage swing of the memory are asymmetric with each other.

In some embodiments, establishing the first voltage swing includes establishing a signal swing that is sufficient to meet specifications of the memory after attenuation by a communication channel between the first transmitter and the second receiver; and establishing the second voltage swing includes establishing a signal swing that is sufficient to meet specifications of the memory controller after attenuation by a communication channel between the second transmitter and the first receiver.

In some embodiments, the communication channel between the first transmitter and the second receiver is a first channel of a dual communication channel and the communication channel between the second transmitter and the first receiver is a second channel of the dual communication channel.

In some embodiments, the communication channel between the first transmitter and the second receiver is the same as the communication channel between the second transmitter and the first receiver.

In some embodiments, the controller is a device with faster performance and more sensitivity than the memory and can tolerate lower signal voltages in comparison with the memory.

What is claimed is:

1. An apparatus comprising:
   a first integrated circuit including a first transmitter and a first receiver;
   a second integrated circuit including a second transmitter and a second receiver; and
   an interface including communication channel linking the first transmitter with the second receiver and the first receiver with the second transmitter, wherein the communication channel is one of a single channel or a dual channel;
   wherein the first transmitter is operable to transmit a first signal and the second transmitter is operable to transmit a second signal, a first average voltage swing of the first signal being asymmetric with a second average voltage swing of the second signal.

2. The apparatus of claim 1, wherein the first transmitter is one of a single-ended transmitter or a differential transmitter.

3. The apparatus of claim 1, wherein the first transmitter output is referenced either to low supply wherein a signal reference is to ground, to high supply wherein a signal reference is to a supply voltage, or to a combination of both low supply and high supply.

4. The apparatus of claim 1, wherein an output of the first transmitter includes non-return to zero (NRZ) coding.

5. The apparatus of claim 1, wherein one of the first transmitter's outputs is substantially equal to a supply voltage of one or more supply voltages supplied to the transmitter.

6. The apparatus of claim 1, wherein the first integrated circuit includes a memory controller and wherein the second integrated circuit includes a memory.

7. The apparatus of claim 6, wherein the memory is a dynamic random access memory (DRAM).

8. The apparatus of claim 6, wherein the memory controller is a system on chip (SoC).

9. The apparatus of claim 1, wherein the first receiver of the first integrated circuit has greater signal sensitivity than the second receiver of the second integrated circuit.

10. The apparatus of claim 1, where a supply voltage of the first integrated circuit is smaller than a supply voltage of the second integrated circuit.

11. A method comprising:
    establishing a first voltage swing for transmission from a first integrated circuit, the first integrated circuit including a first transmitter and a first receiver, to a second integrated circuit, the second integrated circuit including a second transmitter and a second receiver;

establishing a second voltage swing for transmission from the second integrated circuit to the first integrated circuit;

transmitting a first signal from the first transmitter to the second receiver using the first voltage swing; and transmitting a second signal from the second transmitter to the first receiver using the second voltage swing;

wherein the first voltage swing and the second voltage swing are asymmetric.

12. The method of claim 11, wherein the first integrated circuit includes a memory controller and wherein the second integrated circuit includes a memory.

13. The method of claim 11, wherein:

establishing the first voltage swing includes establishing a signal swing that is sufficient to meet specifications of the second integrated circuit after attenuation by a communication channel between the first transmitter and the second receiver; and establishing the second voltage swing includes establishing a signal swing that is sufficient to meet specifications of the first integrated circuit after attenuation by a communication channel between the second transmitter and the first receiver.

14. The method of claim 13, wherein the communication channel between the first transmitter and the second receiver is a first channel of a dual communication channel and the communication channel between the second transmitter and the first receiver is a second channel of the dual communication channel.

15. The method of claim 13, wherein the communication channel between the first transmitter and the second receiver is the same as the communication channel between the second transmitter and the first receiver.

16. The method of claim 13, wherein the first receiver has greater signal sensitivity than the second receiver.

17. A system comprising:

a processing element for processing data;

a memory controller including a first transmitter and a first receiver;

a DRAM (dynamic random access memory) for storage of data, the DRAM including a second transmitter and a second receiver; and an interface between the memory controller and the DRAM including a communication channel linking the first transmitter with the second receiver and the first receiver with the second transmitter;

wherein the first transmitter is operable to transmit a first signal and the second transmitter is operable to transmit a second signal, a first average voltage swing of the first signal being asymmetric with a second average voltage swing of the second signal.

18. The system of claim 17, wherein the memory controller is a system on chip (SoC).

19. The system of claim 17, wherein the first receiver of the controller has greater signal sensitivity than the second receiver of the DRAM.

20. A computer-readable storage medium having stored thereon data representing sequences of instructions that, when executed by a processor, cause the processor to perform operations comprising:

establishing a first voltage swing for transmission from a memory controller, the first memory controller including a first transmitter and a first receiver, to a memory, the memory including a second transmitter and a second receiver, via an I/O (input/output) interface;

establishing a second voltage swing for transmission from the memory to the memory controller;

transmitting a first signal from the first transmitter to the second receiver using the first voltage swing; and transmitting a second signal from the second transmitter to the first receiver using the second voltage swing;

wherein the first voltage swing of the memory controller and the second voltage swing of the memory are asymmetric with each other.

21. The medium of claim 20, wherein:

establishing the first voltage swing includes establishing a signal swing that is sufficient to meet specifications of the memory after attenuation by a communication channel between the first transmitter and the second receiver; and establishing the second voltage swing includes establishing a signal swing that is sufficient to meet specifications of the memory controller after attenuation by a communication channel between the second transmitter and the first receiver.

22. The medium of claim 21, wherein the communication channel between the first transmitter and the second receiver is a first channel of a dual communication channel and the communication channel between the second transmitter and the first receiver is a second channel of the dual communication channel.

23. The medium of claim 21, wherein the communication channel between the first transmitter and the second receiver is the same as the communication channel between the second transmitter and the first receiver.

24. The medium of claim 21, wherein the controller is a device with faster performance and more sensitivity than the memory and can tolerate lower signal voltages in comparison with the memory.

* * * * *